United States Patent [19]

Tsukikawa

[11] Patent Number: 5,696,726
[45] Date of Patent: Dec. 9, 1997

[54] COMPLEMENTARY DIFFERENTIAL AMPLIFIER IN WHICH DIRECT CURRENT AMPLIFICATION GAIN CAN BE SET ARBITRARILY AND SEMICONDUCTOR MEMORY DIVICE USING THE SAME

[75] Inventor: Yasuhiko Tsukikawa, Hyogo, Japan

[73] Assignee: Mitsubishi Denki Kabushiki Kaisha, Tokyo, Japan

[21] Appl. No.: 787,334

[22] Filed: Jan. 27, 1997

Related U.S. Application Data

[63] Continuation of Ser. No. 601,563, Feb. 14, 1996, abandoned.

[30] Foreign Application Priority Data

May 11, 1995 [JP] Japan ................... 7-113071

[51] Int. Cl.$^6$ ................... G11C 7/00; H03F 3/45
[52] U.S. Cl. ................... 365/205; 365/206; 365/207; 327/51; 327/52; 327/55
[58] Field of Search ................... 365/205, 206, 365/207; 327/51, 52, 55

[56] References Cited

U.S. PATENT DOCUMENTS 5,248,946  9/1993  Murakami et al. ................... 365/205
5,345,122  9/1994  Takamoto et al. ................... 327/51
5,384,503  1/1995  Shu et al. ................... 327/52

FOREIGN PATENT DOCUMENTS 2-186668  11/1989  Japan .
4-79080   12/1992  Japan .
7-130185  5/1995   Japan .

*Primary Examiner*—Son T. Dinh
*Attorney, Agent, or Firm*—Lowe, Price, LeBlanc & Becker

[57] ABSTRACT

P channel MOS transistors P11 and P12 have their gates cross-connected to their drains. P channel MOS transistors P13 and P14 each having its gate and its drain diode-connected to each other are respectively connected in parallel to transistors P11 and P12. N channel MOS transistors N15 and N16 drive transistors P11 to P14 with current values corresponding to input signals IN and /IN. If transistors P11–P14 have the same gate length, transistors P11 and P12 have the same gate width, and transistors P13 and P14 have the same gate width, the DC amplification factor of an internal differential amplifying circuit 1100 of a first stage can be set to a desired value by the ratio of a gate width of P13 to a gate width of P11. Internal outputs from nodes to which the drains of P11 and P12 are respectively connected are input to an internal differential amplifying circuit 1200 of the following stage.

12 Claims, 16 Drawing Sheets

FIG. 12(a)

| DATA | ARBITRARY | H | L |
|---|---|---|---|
| VALID FLAG ($\phi$) | L | H | H |
| MEANING | INVARID | H | L |

FIG. 12(b)

| DATA | H | H | L |
|---|---|---|---|
| /DATA | L | H | H |
| MEANING | INHIBIT | H | L |

5,696,726

COMPLEMENTARY DIFFERENTIAL AMPLIFIER IN WHICH DIRECT CURRENT AMPLIFICATION GAIN CAN BE SET ARBITRARILY AND SEMICONDUCTOR MEMORY DEVICE USING THE SAME

This application is a continuation of application Ser. No. 08/601,563 filed Feb. 14, 1996, now abandoned.

BACKGROUND OF THE INVENTION

1. Field of the Invention

The present invention relates to a complementary differential amplifier used in a semiconductor integrated circuit, in particular, in a semiconductor memory circuit for amplifying small complementary signals to complementary outputs having large amplitude at a high speed.

2. Description of the Background Art

In recent years, with increase in memory capacity of a semiconductor memory device, in particular, a dynamic random access memory (hereinafter referred to as DRAM), amplitude of a data read signal from a memory cell is increasingly reduced. In order to reduce noise produced at the time of reading data from the memory cell, it is effective to use a so-called folded bit line arrangement. More specifically, since a bit line pair are located close to and parallel to each other, noise having the same phase is removed. Data from the memory cell is read as potential difference produced between the bit line pair, and the potential difference between the bit lines is amplified by a sense amplifier as complementary signals.

On the other hand, in a data line through which memory cell data amplified as the complementary signals is transmitted to a data output buffer circuit, in general, signal delay due to wiring is large. In addition, since the current driving ability of a complementary differential amplifier which drives the data line is limited, the current driving ability is one of the important factors determining the reading speed of the DRAM.

Arrangement of the data line includes a single data line arrangement in which a signal is transmitted to an output buffer through a single data line, and a complementary data line arrangement in which signals complementary to each other are respectively transmitted through two data lines.

FIG. 14 is a circuit diagram showing a data read circuit having a single data line arrangement in a conventional semiconductor memory device.

When a word line WL selected by an external address signal attains an "H" level by means of a row decoder 901, a memory cell transistor 710 in a memory cell 711 is rendered conductive, so that a memory cell capacitor 903 and a bit line BL are connected to each other.

A potential at the bit line BL varies according to charges which have been stored in memory cell capacitor 903, and potential difference produced between a bit line pair BL and ZBL is amplified by a sense amplifier 902.

A column decoder 900 causes a potential at a column selection line CSL corresponding to a selected column to attain an "H level by a signal φ1 from a clock generating circuit (not shown). Thus, N channel MOS transistors 720 and 721 are rendered conductive, the bit line pair BL and ZBL which have been in potential conditions complementary to each other according to storage information of memory cell 711 are connected to a data line pair IO and ZIO, respectively.

A differential amplifier 910 amplifies potential difference between the data line pair IO and ZIO, and outputs its output to a selector/data latch circuit 915.

Selector/data latch circuit 915 holds a signal from differential amplifier 910, and outputs the signal to a data bus driver circuit 925 in response to a signal φ2 from the clock generating circuit (not shown).

A signal from data bus driver circuit 925 is transmitted through a data bus ZRBUS to be signals OD and ZOD which are complementary to each other by means of inverters 1001 and 1002.

An output buffer circuit 47 receives signals OD and ZOD, and outputs data to an external output terminal DOUT in response to a signal φ3 from the clock generating circuit (not shown).

An operation of the read circuit of FIG. 14 will now be described. FIG. 15 is a timing chart illustrating an operation of the read circuit of FIG. 14.

An example in which an external column strobe signal Ext.ZCAS and an external output enable signal Ext.ZOE fall from "H" levels to "L" levels and data Y1 of an external address signal Add is accessed will now be described.

When data of external address signal Add changes from Y0 to Y1, a pulse is generated at time t0 in a signal φ0 output from an address transition detector (not shown). At this time, a signal φ1 at an H" level is generated by the clock generating circuit (not shown) in response to the rise of the signal φ0.

As a result, column decoder 900 selects a column selection line CSL. Thus, read data from memory cell 711 is transmitted through the bit line pair BL and ZBL to the data line pair IO and ZIO, respectively. Consequently, potential difference is produced between the data line pair IO and ZIO.

Then, a signal φ2 attains an "H" level at time t1 in response to the fall of the signal φ0. Thus, differential amplifier 910 operates, and selector/data latch circuit 915 is rendered conductive to output a signal ZRDA in response to a signal RD output from differential amplifier 910.

Then, data bus driver circuit 925 drives data bus ZRBUS in response to the signal ZRDA. Inverters 1001 and 1002 respectively generates signals OD and ZOD at time t2 in response to data of the driven data bus ZRBUS, and these signals are transmitted to output buffer 47. After receiving signals OD and ZOD, output buffer 47 starts operating at time t3 when a signal φ3 from the clock generating circuit (not shown) attains an "H" level, and outputs an external output data signal DOUT.

It is now assumed that a signal φ3 which activates output buffer 47 attains an "H" level at time t30 prior to time t2. In this case, output buffer 47 starts operating before time t2 when read data from memory cell 711 is transmitted to output buffer 47. Therefore, output buffer 47 once outputs, as read data, an "H" level of a signal RD output during stand-by of differential amplifier 910.

In such a case, an "H" level data (invalid data) opposite to an "L" level true data is once output as an external output data signal DOUT. Accordingly, the time when the external output data signal DOUT goes to an "L" level of true data is delayed by Δt compared to the case of a normal operation. In order to solve such a problem, a timing when an operation of output buffer 47 is started must be delayed until a signal output from differential amplifier 910 is transmitted to output buffer 47.

In a memory having large capacity, however, since signal propagation time through a data bus ZRBUS increases with increase in chip size, time required for an output signal of differential amplifier 910 to be transmitted to output buffer 47 increases. In addition, at the time of determining a timing when output buffer 47 is activated, it is necessary to delay a timing when a signal φ3 attains an "H" level, allowing for variation in performance of transistors provided between differential amplifier 910 and output buffer 47.

However, even if an output signal of differential amplifier 910 has arrived at output buffer 47, an external output data signal DOUT will not be output so long as a signal φ3 does not attain an "H" level. Accordingly, if a timing when a signal φ3 is rendered at an "H" level is delayed too much, the invalid data described above will not be output, but an access is delayed instead.

SUMMARY OF THE INVENTION

It is an object of the present invention to provide a complementary amplifier in which direct current amplification gain can be set arbitrarily.

It is another object of the present invention to provide a semiconductor memory device in which delay of transmission speed is reduced by carrying out transmission of an output signal by means of complementary signals amplified by such a complementary amplifier as described above.

The present invention, in summary, is a complementary differential amplifier for amplifying difference in level between complementary inputs to generate complementary outputs, and includes cascade-connected internal differential amplifying circuits of a plurality of stages for receiving complementary inputs as complementary inputs of the first stage and amplifying them sequentially. Each internal differential amplifying circuit includes a pair of first and second internal output nodes where complementary internal outputs are produced, respectively; a pair of first and second MOS transistors of a first conductivity type having their sources coupled to a first power supply potential, their gates cross-connected to their drains, and their drains respectively connected to the pair of internal output nodes; diode-connected third and fourth MOS transistors of a first conductivity type respectively connected between a first power supply and the pair of internal output nodes and in parallel to the pair of first and second MOS transistors of a first conductivity type; and a driving circuit connected between the pair of internal output nodes and a second power supply for driving the first to the fourth MOS transistors in response to the complementary inputs in the case of the first stage and to complementary internal outputs of the previous stage in the case of the following stages.

Preferably, according to another aspect of the present invention, if the size of an MOS transistor is defined by (gate width)/(gate length), the first and the second MOS transistors have a first size, and the third and fourth MOS transistors have a second size, wherein the second size is larger than the first size.

Accordingly, a primary advantage of the present invention is that a DC gain can be adjusted to a desired value by adjustment of the gate widths and the gate lengths of the first and the second transistors as well as the third and the fourth MOS transistors and by setting of the number of stages of the amplifier. Consequently, degree of freedom in design can be improved significantly, and delay time of a logic circuit driven by the amplifier can be reduced.

Another advantage of the present invention is that a desired DC gain can be obtained by adjusting the number of stages and values of the ratios (gate width)/(gate length) of the first and the second MOS transistors as well as the third and the fourth MOS transistors.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3(a) and 3(b) are a circuit diagram showing a first small signal model of a complementary differential amplifier in accordance with the first embodiment of the present invention, wherein FIG. 3(a) is a circuit diagram showing a differential amplifying circuit, and FIG. 3(b) is a circuit diagram showing a small signal model of FIG. 3(a).

FIGS. 4(a) and 4(b) are a circuit diagram showing a second small signal model of the first embodiment of the present invention, wherein FIG. 4(a) is a circuit diagram showing a driving circuit, and FIG. 4(b) is a circuit diagram showing a small signal model of FIG. 4(a).

FIGS. 12(a) and 12(b) are diagrams showing an operation of the output buffer circuit in the fourth embodiment of the present invention, wherein FIG. 12(a) shows an operation thereof in the case of a single data line, and FIG. 12(b) shows an operation thereof in the case of complementary data lines.

DESCRIPTION OF THE PREFERRED EMBODIMENTS

[First Embodiment]

Figure 1:
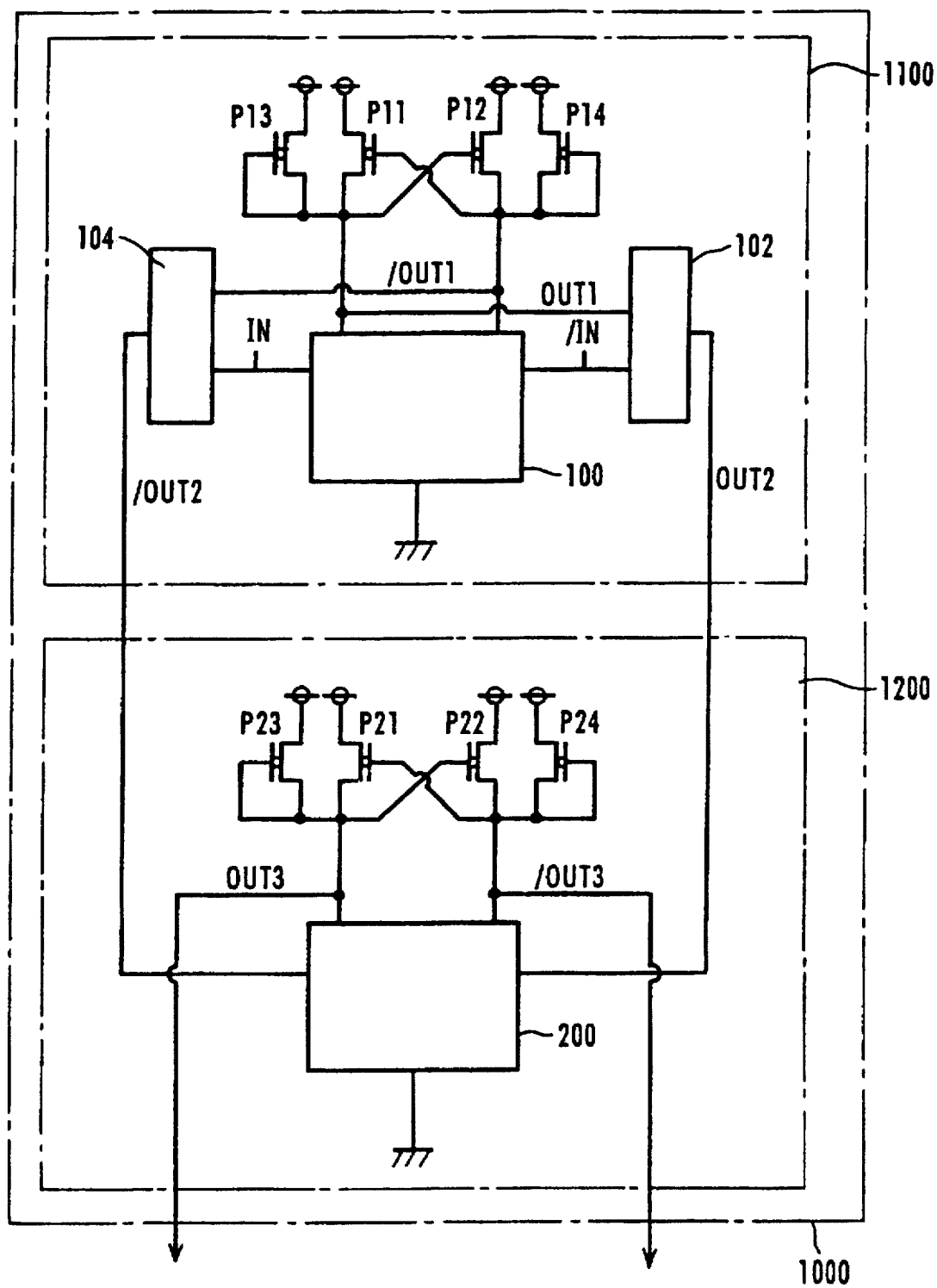
FIG. 1 is a schematic block diagram showing an arrangement of a complementary differential amplifier in accordance with a first embodiment of the present invention.

FIG. 1 is a schematic block diagram showing an arrangement of a complementary differential amplifier in accordance with a first embodiment of the present invention.

Each of P channel MOS transistors P11, P12, P13 and P14 has its source connected to the power supply Vcc. P11 and P12 have their gates cross-connected to their drains. P13 and P14 have their respective gates and drains diode-connected, and are respectively connected in parallel to P11 and P12.

A current driving circuit 100 drives current flowing into P11, P12, P13 and P14 in response to complementary inputs IN and /IN. Potentials at the drains of P11 and P12 are extracted as respective outputs, and then input to a current driving circuit 200 in the next stage through internal driver circuits 102 and 104, respectively.

An internal complementary amplifier 1200 in the above-mentioned next stage includes P channel MOS transistors P21, P22, P23 and P24 having connection similar to that in the case of P channel MOS transistors P11, P12, P13 and P14. Current driving circuit 200 receives the outputs OUT2 and /OUT2 of the first stage as inputs, and responsively drives P21, P22, P23 and P24. Potentials at the drains of P21 and P22 are output to the following stage as internal outputs OUT3 and /OUT3, respectively.

Figure 2:
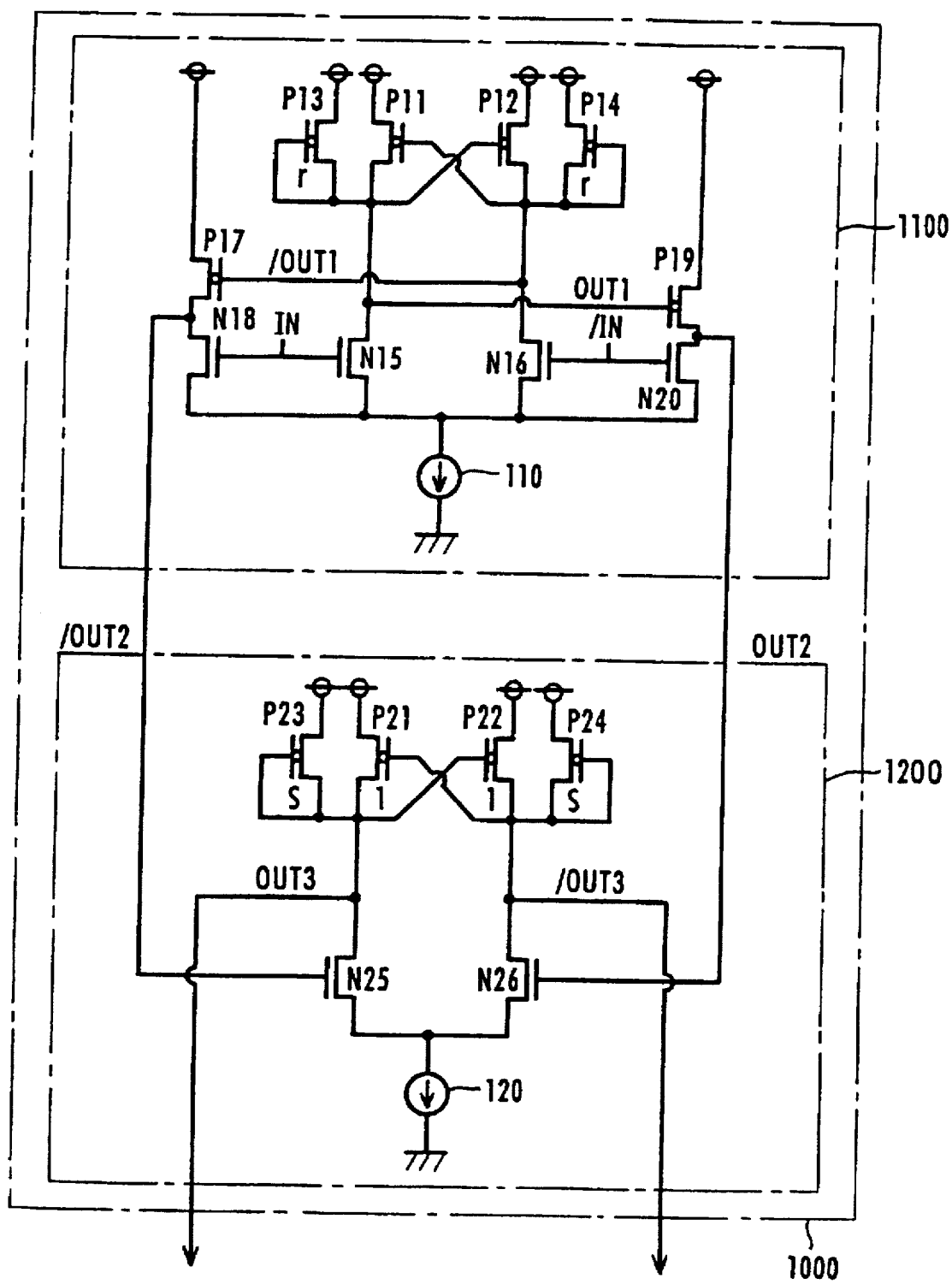
FIG. 2 is a circuit diagram showing an arrangement of a complementary differential amplifier in accordance with the first embodiment of the present invention.

FIG. 2 is a circuit diagram showing an arrangement of the complementary differential amplifier in accordance with the first embodiment in more detail.

Current driving circuit 100 consists of a pair of N channel MOS transistors N15 and N16 and a constant current source 110. Similarly, current driving circuit 200 consists of N channel MOS transistors N25 and N26 and a constant current source 120.

Complementary inputs IN and /IN are input to the gates of N15 and N16, respectively. Internal outputs OUT2 and /OUT2 from the first stage are input to the gates of N channel MOS transistors N26 and N25, respectively.

Internal driver circuit 102 consists of a P channel MOS transistor P19 and an N channel MOS transistor N20 which are connected in series between the power supply Vcc and current source 110. OUT1 which is a potential at the drain of P11 is input to the gate of P19, and one signal /IN of the complementary inputs is input to the gate of N20. A potential at the connection point of P19 and N20 is extracted as an internal output OUT2.

Similarly, internal driver circuit 104 consists of a P channel MOS transistor P17 and an N channel MOS transistor N18. /OUT1 which is a potential at the drain of P12 is input to the gate of P17, and the other signal IN of the complementary inputs is input to the gate of N18. A potential at the connection point of P17 and N18 is extracted as an internal output /OUT2.

In internal differential amplifying circuit 1200 in the second stage, internal outputs OUT2 and /OUT2 of the first stage are input to the gates of N channel MOS transistors N26 and N25, respectively.

The amplification factor of a two-stage amplifier consisting of internal differential amplifier 1100 in the first stage and internal differential amplifier 1200 in the second stage shown in FIG. 2 will now be calculated by analysis of a small signal property.

(1) First Step

Figure 3A:
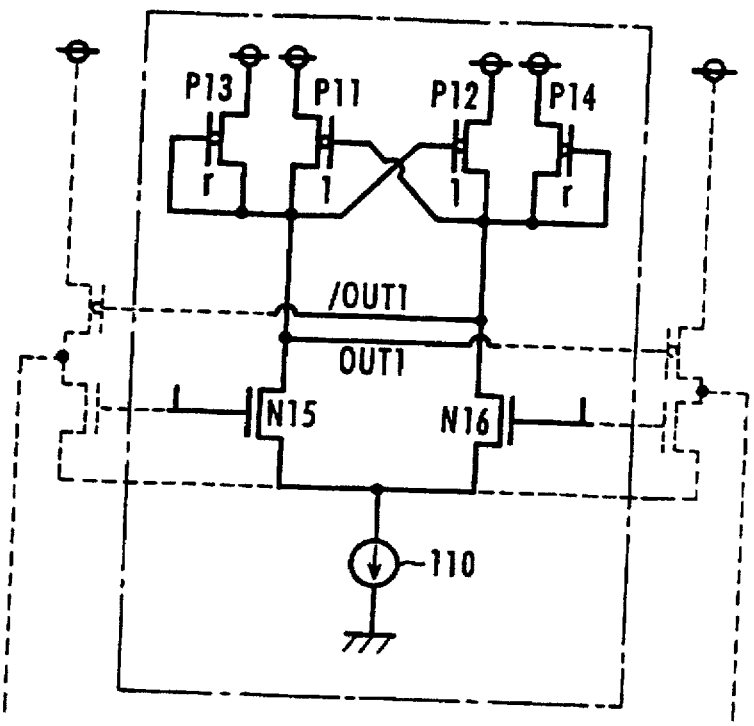

FIG. 3(a) is a circuit diagram showing a circuit consisting of P channel MOS transistors P11, P12, P13 and P14 and N channel MOS transistors N15 and N16 which are included in internal differential amplifier 1100 in the first stage of the two-stage amplifier shown in FIG. 2.

Figure 3B:
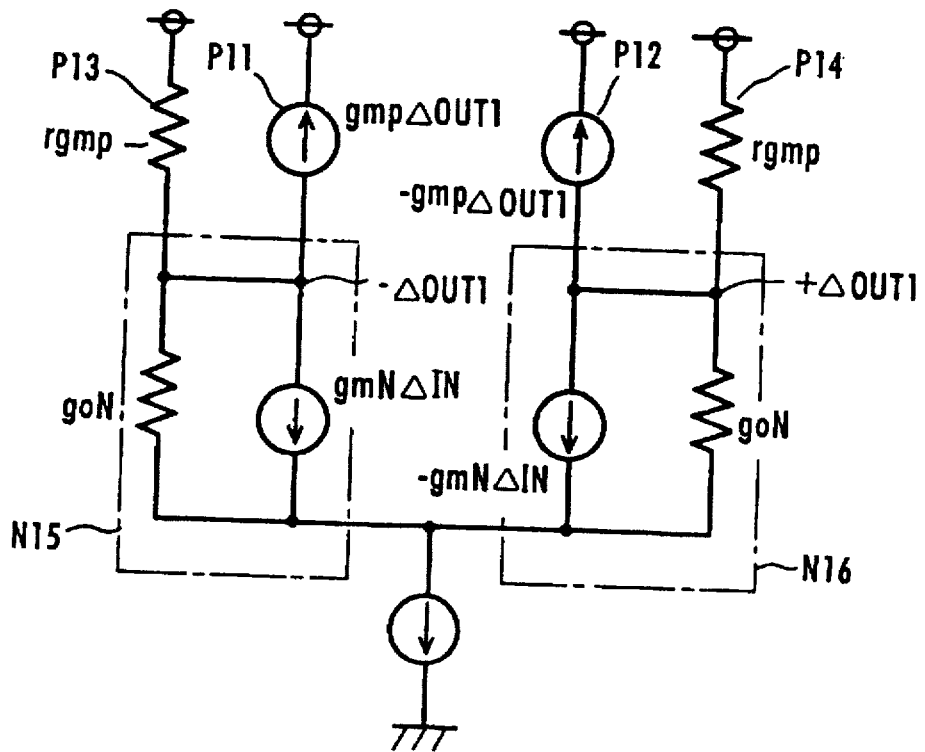

FIG. 3(b) is a small signal model of the above-described circuit.

More specifically, each of P channel MOS transistors P11 and P12 is approximated to a constant current source for outputting current proportional to change in a gate potential.

In the following, size of a transistor is defined by (gate width)/(gate length), and it is assumed that P11 and P12 have the same size and P13 and P14 have the same size. Furthermore, the ratio of the size of P13 to the size of P11 is herein represented by r (wherein r>1).

Since an internal output/OUT1 is input to the gate of P11, an output of the constant current source for small change $\Delta$OUT1 in the internal output has the following value.

$$g_{mP}\Delta\text{OUT1} \tag{1}$$

Similarly, since an inverted signal OUT1 of an input signal to P11 is input to the gate of P12, an output of a constant current source corresponding to P12 has the following value.

$$-g_{mP}\Delta\text{OUT1} \tag{2}$$

Since each of P channel MOS transistors P13 and P14 has its gate and its drain diode-connected, each of P channel MOS transistors P13 and P14 is approximated to a resistance value proportional to transconductance in a small signal model. Accordingly, a resistance value corresponding to P13 has the following value.

$$rg_{mP} \tag{3}$$

Similarly, a resistance value corresponding to P14 has the following value.

$$rg_{mP} \tag{4}$$

On the other hand, each of N channel MOS transistors N15 and N16 is approximated to parallel connection of drain conductance and a constant current source having an output proportional to small potential difference of an input thereto.

Accordingly, in N15, an output of the constant current source and the drain conductance have the following values, respectively.

$$g_{mN}\Delta\text{IN} \tag{5}$$

$$g_{oN} \tag{6}$$

Similarly, in N16, since an input complementary to that of N15 is input to N16, an output of the constant current source and the drain conductance have the following values, respectively.

$$-g_{mN}\Delta\text{IN} \tag{7}$$

$$g_{oN} \tag{8}$$

Under the foregoing conditions, if Kirchhoff's law is applied to a node to which an internal output OUT1 is output, for example, the following equations can be obtained.

$$-(rg_{mP}+g_{oN})\Delta\text{OUT1}+g_{mN}\Delta\text{IN}+g_{mP}\Delta\text{OUT1}=0 \ \{g_{mP}(1-r)-g_{oN}\} \\ \Delta\text{OUT1}+g_{mN}\Delta\text{IN}=0 \tag{9}$$

Accordingly, if the above equations (9) are deformed, the following equation can be obtained.

$$\Delta\text{OUT1}/\Delta\text{IN}=g_{mN}/\{g_{mP}(r-1)+g_{oN}\} \tag{10}$$

In addition, if approximation is performed on the assumption that $g_{mP}$ is sufficiently larger than $g_{oN}$, the following equation can be obtained.

$$\Delta\text{OUT1}/\Delta\text{IN}=1/(r-1)\cdot g_{mN}/g_{mP} \tag{11}$$

(2) Second Step

Now, the amplification factor for each of the internal driver circuits respectively constituted by P17 and N18, and P19 and N20 will be calculated similarly.

Figure 4A:
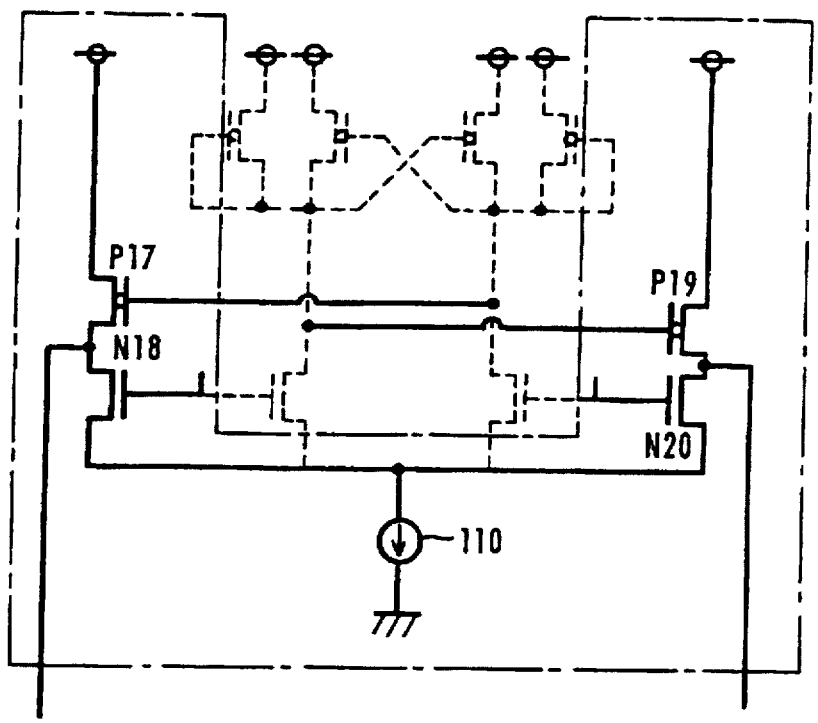

FIG. 4(a) is a circuit diagram showing the internal driver circuits described above.

Figure 4B:
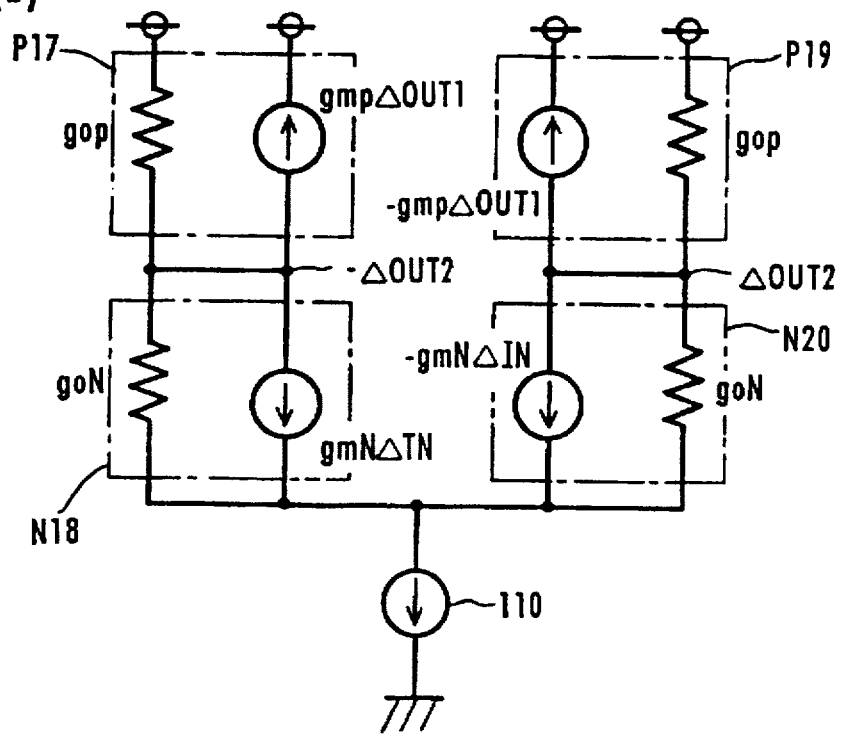

FIG. 4(b) is a small signal model of the circuit shown in FIG. 4(a).

P channel MOS transistor P17 is approximated to parallel connection of drain conductance and a constant current source having an output proportional to an input thereto. An output of the constant current source and the drain conductance have the following values, respectively.

$$g_{mP} \Delta OUT1 \tag{12}$$

$$g_{OP} \tag{13}$$

Similarly, N channel MOS transistor N18 is approximated to parallel connection of a constant current source and drain conductance, and an output of the constant current source and the drain conductance have the following values, respectively.

$$g_{mN} \Delta IN \tag{14}$$

$$g_{ON} \tag{15}$$

Accordingly, if Kirchhoff's law is applied to a node to which /OUT2 is output, the following equation can be obtained.

$$-(g_{OP}+g_{ON})\Delta OUT2+g_{mP}\Delta OUT1+g_{mN}\Delta IN=0 \tag{16}$$

If the above equation (11) is substituted for the above equation (16), the following equation can be obtained.

$$\Delta OUT2/\Delta IN=\{g_{mP}/(r-1)+g_{mN}\}/(g_{OP}+g_{ON}) \tag{17}$$

In addition, if approximation is performed on the assumption of $g_{mP} \cdot 32\ g_{mN}=g_m$ and $g_{OP}=g_{ON}=g_O$, the following equation can be obtained.

$$\Delta OUT2/\Delta IN=\{r/(r-1)\} \cdot g_m/(2g_o) \tag{18}$$

(3) Third Step

For a gain of the second stage, P channel MOS transistors P21 and P22 have the same size, and P channel MOS transistors P23 and P24 have the same size, as in the case of the first step described above. In addition, the ratio of the size of P23 to the size of P21 is represented by s.

The following calculation can be performed as in the case of the first step, and the gain is represented by the following equation.

$$\Delta OUT3/\Delta OUT2=\{1/(s-1)\} \cdot g_m/g_o \tag{19}$$

Consequently, a gain of the whole two-stage complementary amplifier is as follows.

$$G_{22}=\Delta OUT3/\Delta IN=\{r/(r-1)(s-1)\} \cdot (g_m/g_o)^2/2 \tag{20}$$

Figure 15:
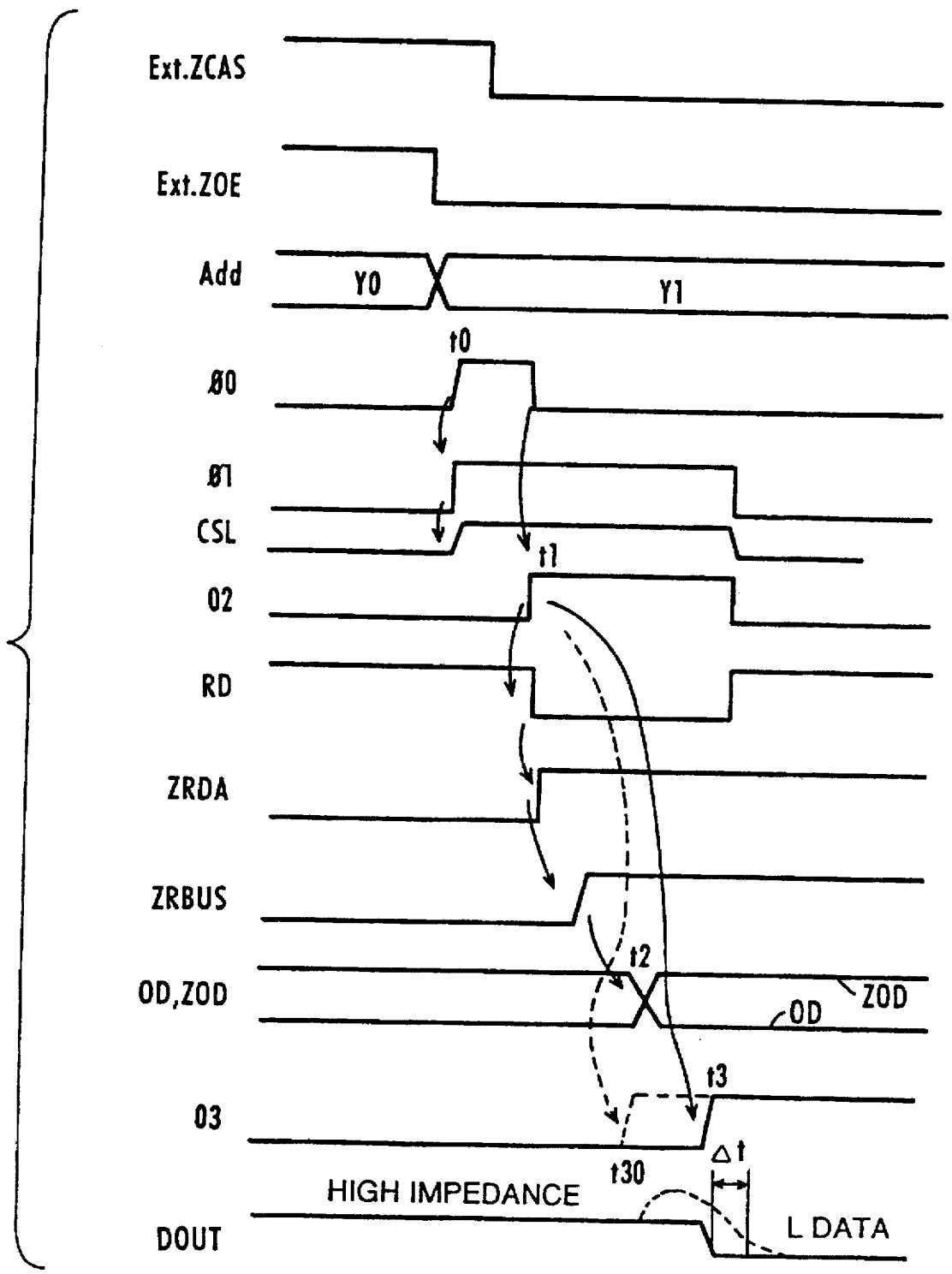
FIG. 15 is a timing chart showing an operation of the conventional read circuit.

Accordingly, as opposed to the conventional example shown in FIG. 15, a gain $G_{22}$ of complementary amplifier 1000 can be adjusted by parameters r and s which can be determined by design, as well as by constants $g_m$ and $g_o$ determined by an operating point of a transistor.

Therefore, a desired gain can be obtained by setting r and s to arbitrary values close to 1, respectively, whereby a gain of an amplifier can be set more arbitrarily.

Variation in an output level of two-stage complementary amplifier 1000 shown in FIG. 2 for variation in levels of complementary inputs IN and /IN will now be considered.

As can be seen from the following description, this differential amplifying circuit 1000 functions so as not to vary output signals OUT 2 and /OUT2 even if the levels of input signals IN and /IN vary with respect to the reference level. More specifically, this differential amplifier 1000 serves to compensate for variation in voltage.

Such a compensation function for variation in voltage will now be described.

Transistors N15 and N18 are rendered conductive or non-conductive simultaneously, and transistors N16 and N20 are also rendered conductive or non-conductive simultaneously.

Transistors P12 and P19 are rendered conductive or non-conductive simultaneously in response to a potential at the drain of transistor N15. Transistors P11 and P17 are rendered conductive or non-conductive simultaneously in response to a potential at the drain of transistor N16.

Transistors P11 and P12 are cross-coupled to each other. Therefore, if transistor N15 or N18 is rendered conductive, one of transistors P11 and P12 is rendered conductive and the other is rendered non-conductive in response to a potential at the drain of the conductive transistor.

Accordingly, when transistor N18 is rendered conductive in response to an input signal IN, transistor P19 is rendered conductive. Furthermore, if transistor N20 is rendered conductive in response to an input signal /IN, transistor P17 is rendered conductive. Thus, output signals OUT2 and /OUT2 are signals complementary to each other.

The following is description of the case where a level of each of signals IN and /IN varies. For example, if states of transistors N15 and N18 are changed significantly towards a conductive state due to variation in a level of signal IN, a potential at the drains of these transistors varies with respect to a normal level, and a level of an output signal /OUT2 might vary.

However, transistors P11 and P12 are cross-coupled to each other, and therefore, when a potential at the drain of transistor N15 varies, a potential at the common drain of transistors P12 and P14 varies in an opposite direction. Thus, a state of transistor P17 is changed slightly towards a non-conductive state.

Accordingly, a state of transistor N18 is changed significantly towards a conductive state, while a state of transistor P17 is changed slightly towards a nonconductive state, and therefore, variation in a signal /OUT2 resulting from change in a conductive state of transistor N18 is offset by change in a non-conductive state of transistor P17.

Consequently, variation in a signal /OUT2 is suppressed even if a level of a signal IN varies. Such a function is performed similarly in the case of a signal OUT2 as well. In addition, such a function can be performed similarly when a signal /IN varies.

Accordingly, this differential amplifying circuit can compensate for variation in a level of each of input signals IN and /IN. Consequently, high voltage gain can be maintained even if each of input signals IN and /IN varies.

[Second Embodiment]

Figure 5:
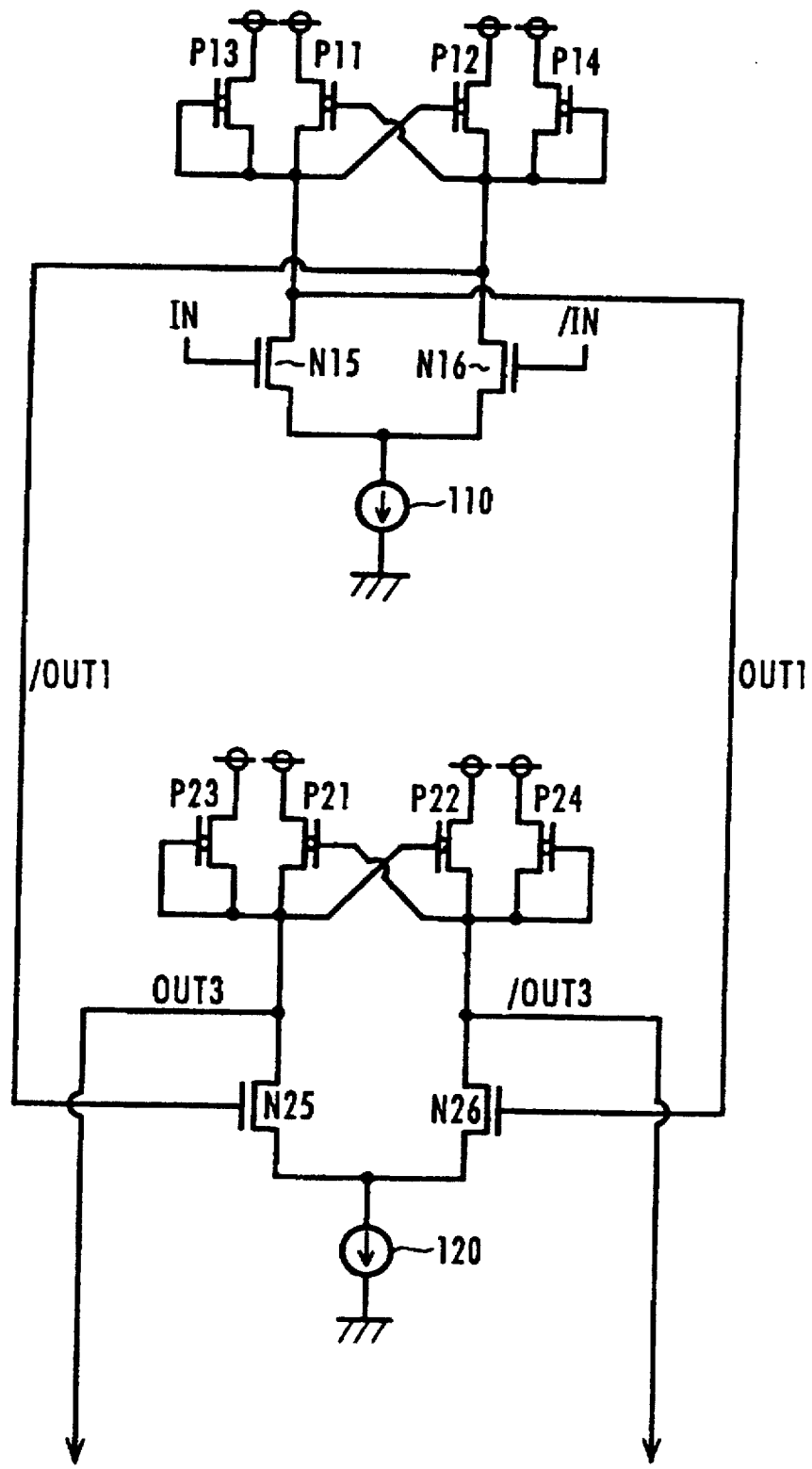
FIG. 5 is a circuit diagram showing a second embodiment of the present invention.

FIG. 5 is a circuit diagram showing an arrangement of a complementary differential amplifier in accordance with a second embodiment of the present invention.

The second embodiment is different from the first embodiment in that outputs of an internal differential amplifying circuit in the first stage are connected not through internal driver circuits 102 and 104 but directly to inputs of the second stage, respectively.

Accordingly, in this case, the small signal amplification factor of this two-stage amplifier is defined by the following expression obtained by calculation similar to the case of the first embodiment.

$$1/(r-1)(s-1) \cdot (g_m/g_o)^2 \tag{21}$$

More specifically, in this circuit as well, the amplification factor of a first stage amplifier can be adjusted not only by an operating point of a transistor but also by amounts r and s depending on transistor size, so that the amplification factor can be set more arbitrarily.

The present embodiment does not have such a compensation function for variation in levels of inputs IN and /IN as that in the first embodiment. However, the number of transistors constituting the amplifier is reduced, and therefore, the layout area of the amplifier can be reduced when formed on a semiconductor substrate.

[Third Embodiment]

Figure 6:
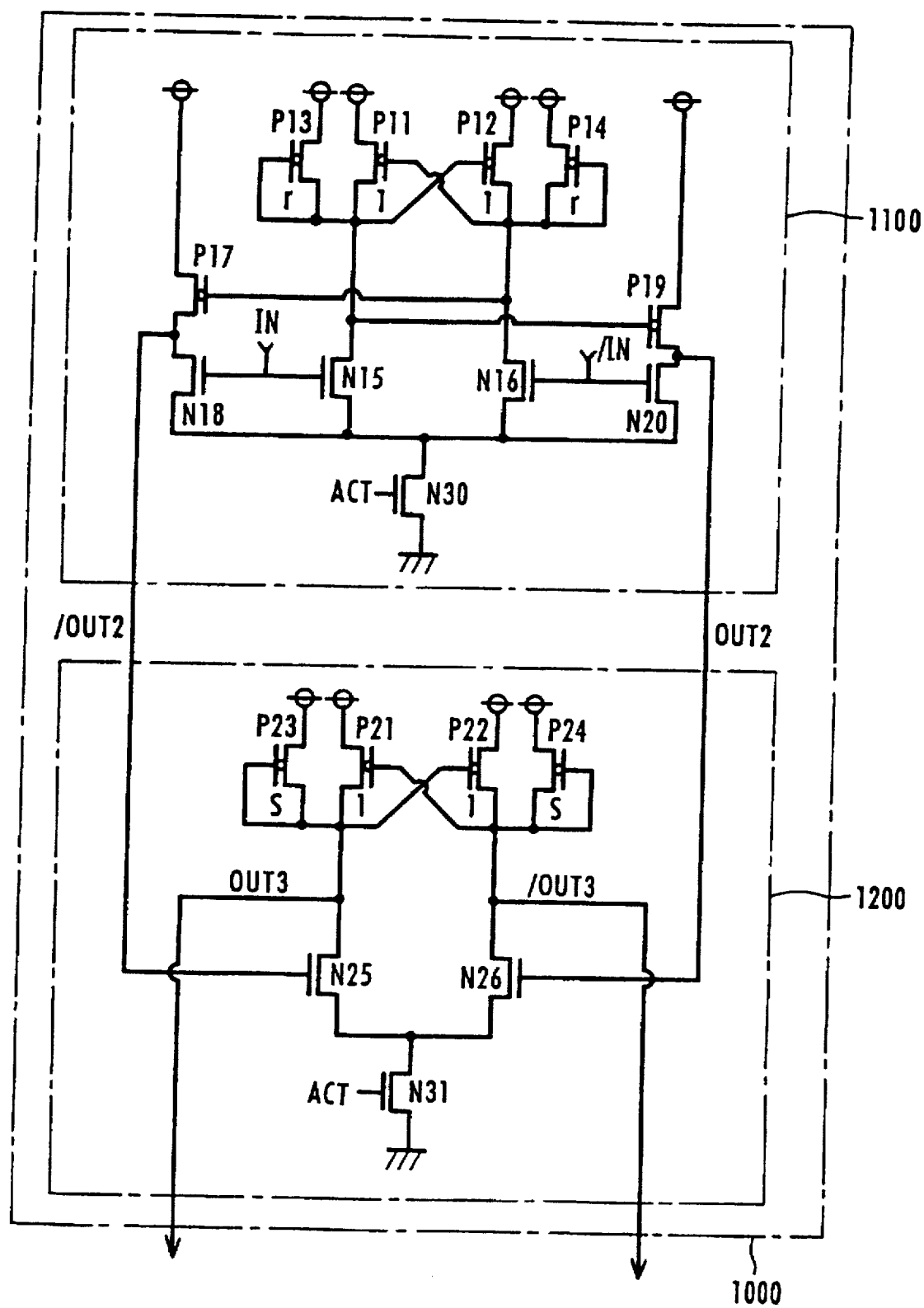
FIG. 6 is a circuit diagram showing a third embodiment of the present invention.

FIG. 6 is a circuit diagram showing an arrangement of a complementary differential amplifier in accordance with a third embodiment of the present invention.

The third embodiment is different from the first embodiment in that constant current sources 110 and 120 are respectively N channel MOS transistors N30 and N31 each controlled by a differential amplifier activation signal ACT. Accordingly, when this circuit is used in an integrated circuit, an operation of this two-stage amplifier can be controlled by a differential amplifier activation signal ACT. More specifically, an operation of this amplifying circuit can be stopped when an amplifying operation is on stand-by, for example.

[Fourth Embodiment]

Figure 7:
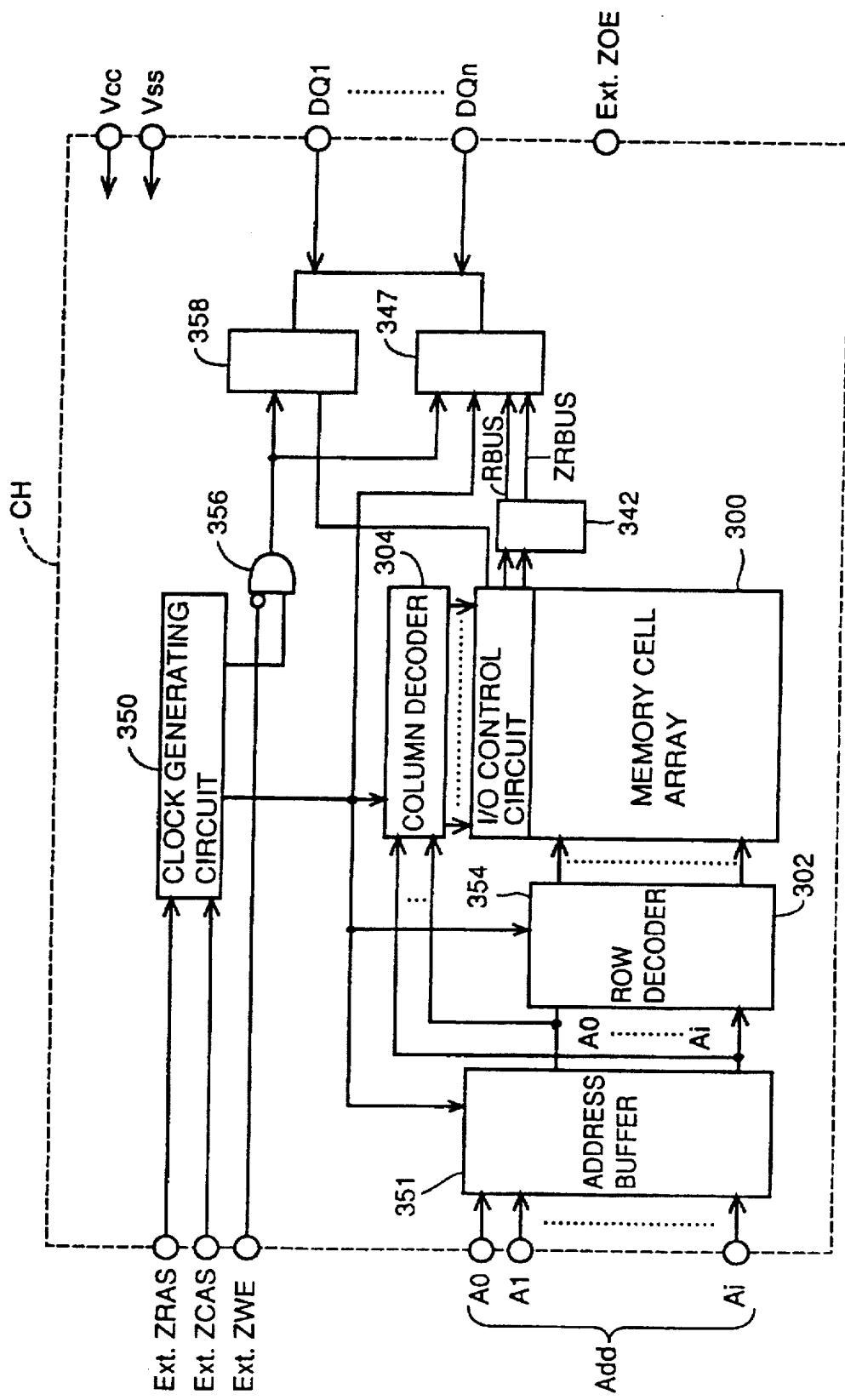
FIG. 7 is a schematic block diagram showing a fourth embodiment of the present invention.

FIG. 7 is a schematic block diagram showing a circuit arrangement of an example in which a complementary differential amplifier in accordance with the present invention is applied to a DRAM.

According to the circuit arrangement of FIG. 7, data buses arranged in a complementary data line arrangement enables a timing when an output buffer circuit 47 outputs data to be controlled not by a timing of a signal φ3 from a clock generating circuit (not shown) but by a timing of transmitted data itself. More specifically, data lines are complementary to each other, and therefore, signal levels of the data line pair are set to "L" levels, for example, before data arrives at the output buffer, and a level of one data line of the data line pair goes to an "H" level while the other data line goes to an "L" level after arrival in response to a signal level, and output buffer circuit 47 detects the "H" level of one data line and the "L" level of the other data line to output data.

Such a complementary data line arrangement as described above is also disclosed in copending application Ser. No. 08/304,749 filed on Dec. 9, 1994.

Figure 16:
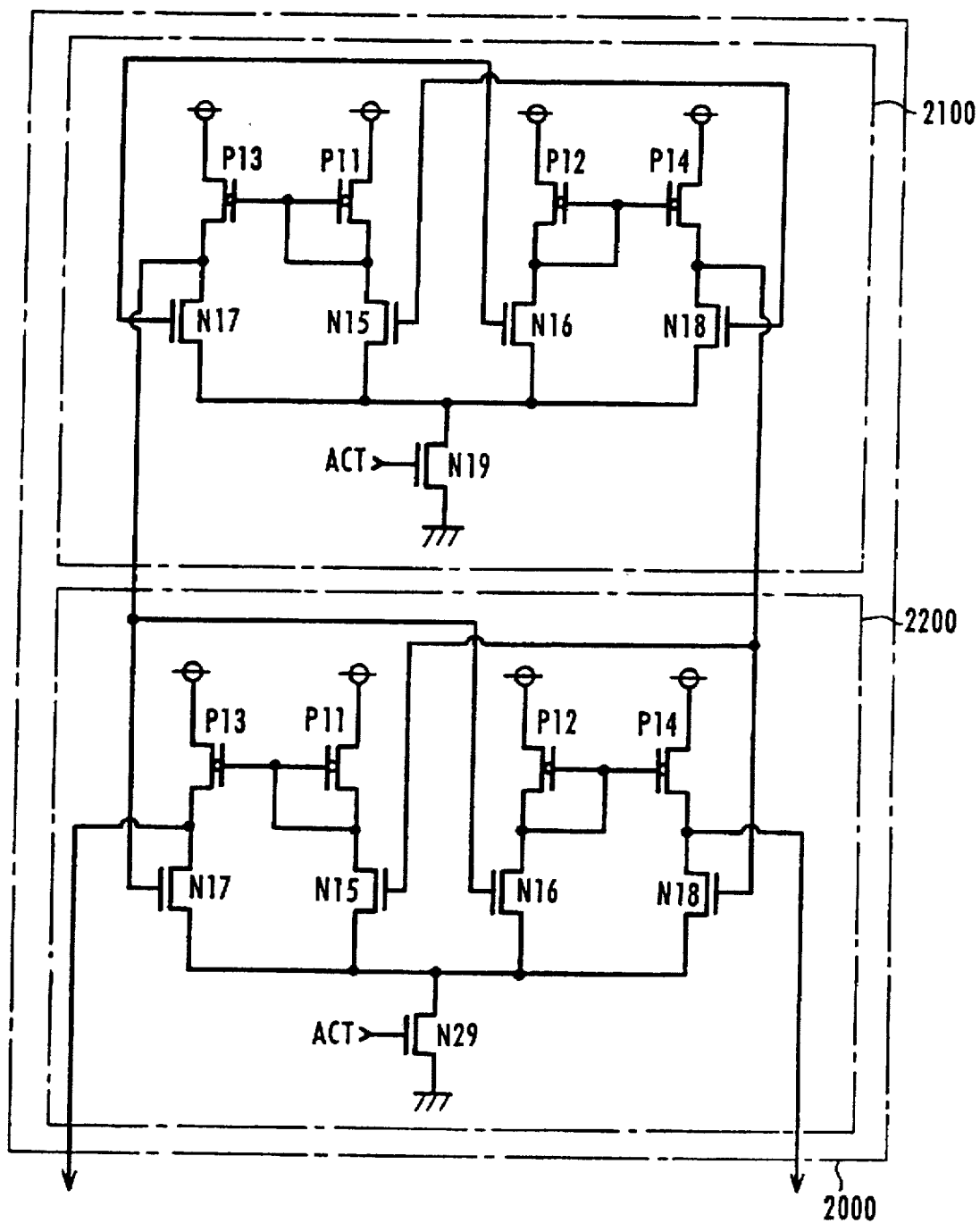
FIG. 16 is a circuit diagram showing an arrangement of a conventional complementary differential amplifier.

A conventional complementary differential amplifier of FIG. 7 of Japanese Patent Laying-Open No. 4-79080 is shown in FIG. 16 as an example a differential amplifier for outputting signals to such complementary data buses.

In this example, a complementary amplifier 2000 performs differential amplification in two stages consisting of an internal differential amplifier 2100 and an internal differential amplifier 2200. A feature of this conventional example is that each of internal differential amplifiers 2100 and 2200 uses a pair of asymmetric current mirror type differential amplifying circuits of opposite phases, producing complementary outputs in opposite phases. A direct current amplification gain $G_{o1}$ of internal differential amplifier 2100 in the first stage is defined by the following equation when transconductance of an MOS transistor is represented by $g_m$ and drain conductance thereof by $g_o$.

$$G_{o1} = g_m \quad (22)$$

In addition, since differential amplifier 2200 in the second stage is structured similarly to differential amplifier 2100 in the first stage, the total direct current amplification gain $G_{o2}$ of two stages is defined by the following equation.

$$G_{o2} = (g_m/g_o)^2 \quad (23)$$

Since $g_m$ is larger than $g_o$, a large direct current amplification gain can be obtained by two-stage amplification.

However, the conventional complementary differential amplifier shown in FIG. 16 has the following problems.

More specifically, a direct current amplification gain is determined by constants such as $g_m$ and $g_o$ determined by an operation point of a transistor. Accordingly, a circuit can be designed less arbitrarily, and a differential amplifier having three stages or more is required in order to obtain a larger direct current amplification gain. This has disadvantages of reduction in a circuit speed and increase in a layout area.

Thus, the present invention has a structure as described below in order to solve the above problems.

In FIG. 7, an address buffer 351 selectively supplies externally applied address signals A0–Ai to a row decoder 302 and a column decoder 304. Row decoder 302 drives one of a plurality of word lines WLs in response to a row address signal supplied from address buffer 351. Column decoder 304 selects one of a plurality of bit line pairs in response to a column address signal supplied from address buffer 351.

In read operation, an I/O control circuit 354 amplifies potential difference between a corresponding bit line pair. An amplified signal corresponding to a bit line pair selected by column decoder 304 is supplied to an output buffer 347 through a data bus driver circuit 342. Output buffer 347 amplifies the supplied potential to externally output the resultant signal as output data DQ1–DQn.

In write operation, a data input buffer 358 amplifies externally supplied input data DQ1–DQn. The amplified signal is supplied to a bit line pair selected by column decoder 304.

A clock generating circuit 350 generates an internal clock for controlling an operation of each internal circuit in response to an externally supplied row strobe signal Ext.ZRAS and an externally supplied column strobe signal Ext.ZCAS. An operation of output buffer circuit 347 is controlled by this clock signal and an externally applied output enable signal Ext.ZOE. Input buffer circuit 358 is controlled by the clock signal from clock generating circuit 350 and an externally applied write enable signal Ext.ZWE.

Figure 13:
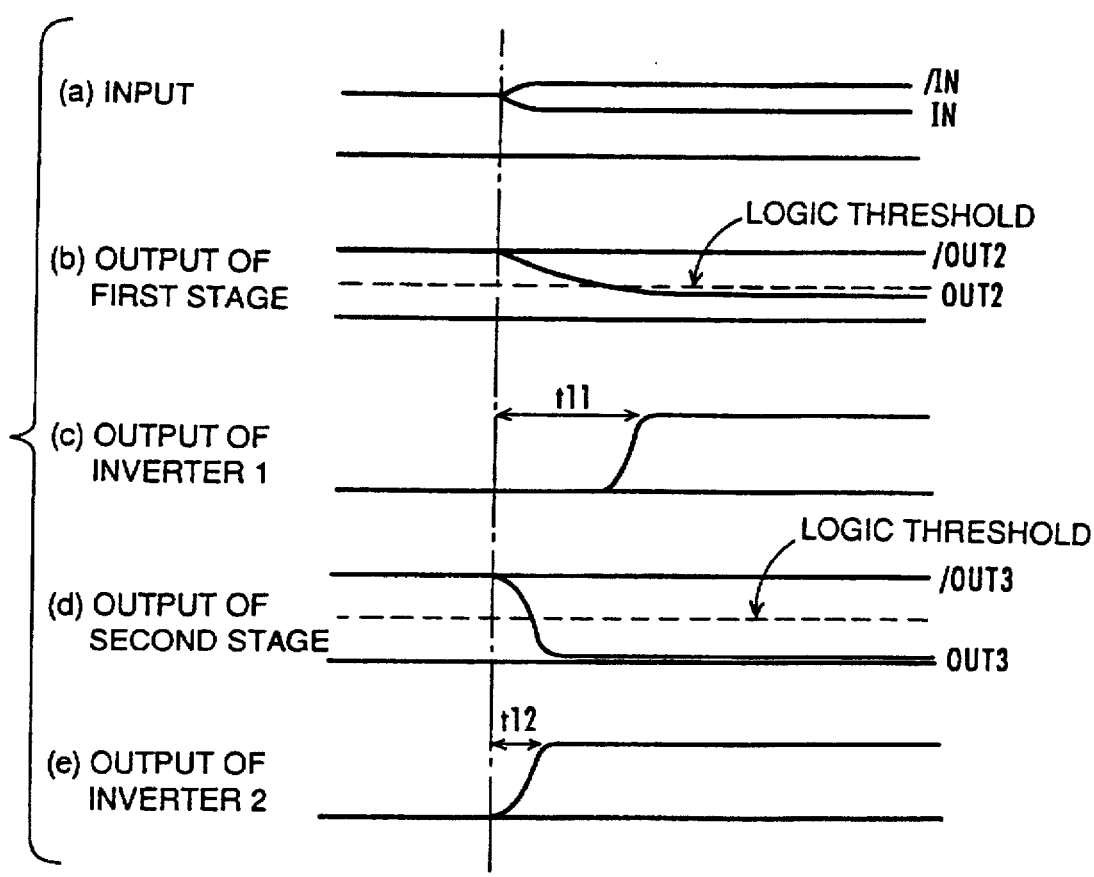
FIG. 13 is a waveform chart showing driving ability of a complementary differential amplifier in accordance with the present invention.

The structure of the DRAM circuit shown in FIG. 7 is different from that shown in FIG. 13 in that data transmission from I/O control circuit 354 to output buffer circuit 347 is carried out through complementary type data buses RBUS and ZRBUS.

Figure 8:
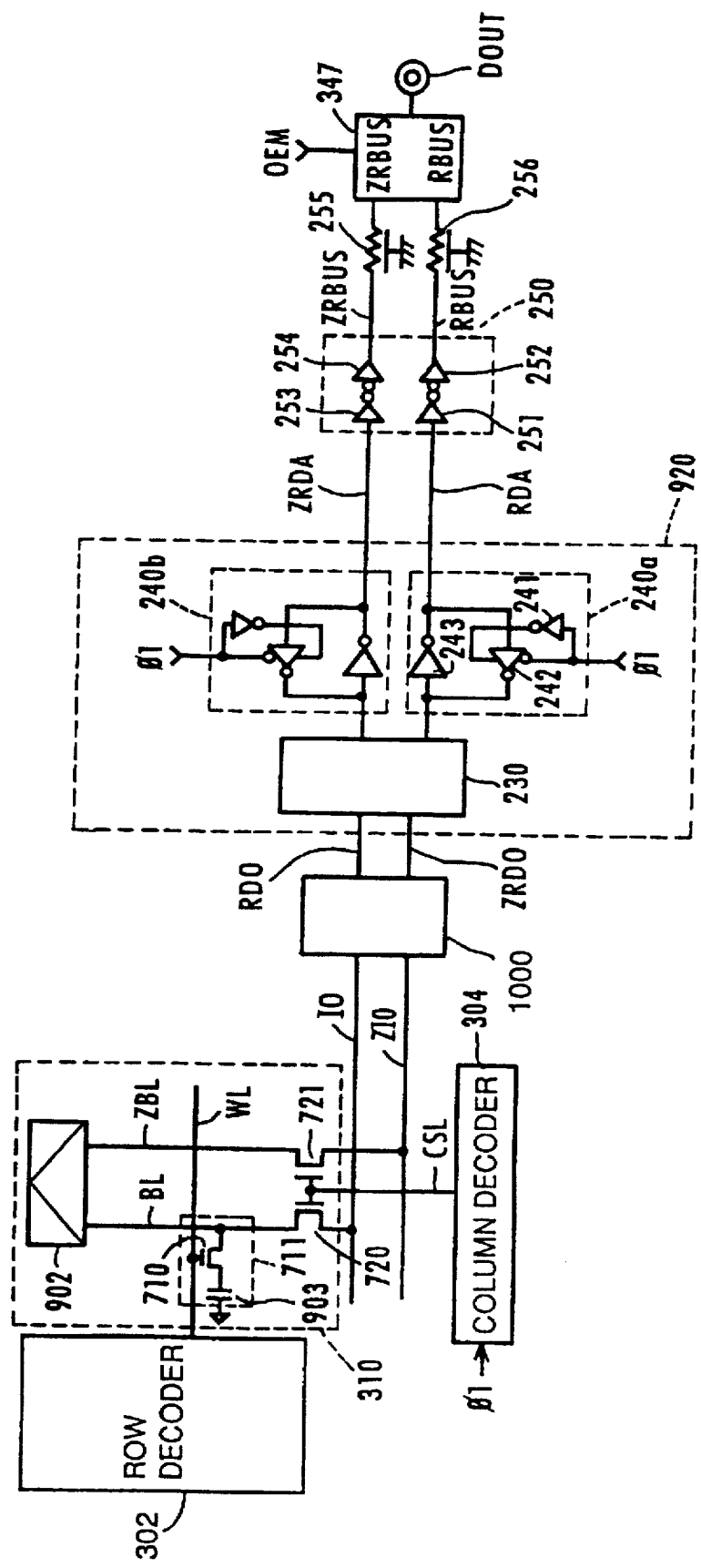
FIG. 8 is a circuit diagram showing the fourth embodiment of the present invention.

FIG. 8 is a schematic block diagram showing a circuit structure of I/O control circuit 354 to output buffer circuit 347 in the DRAM shown in FIG. 7.

Figure 14:
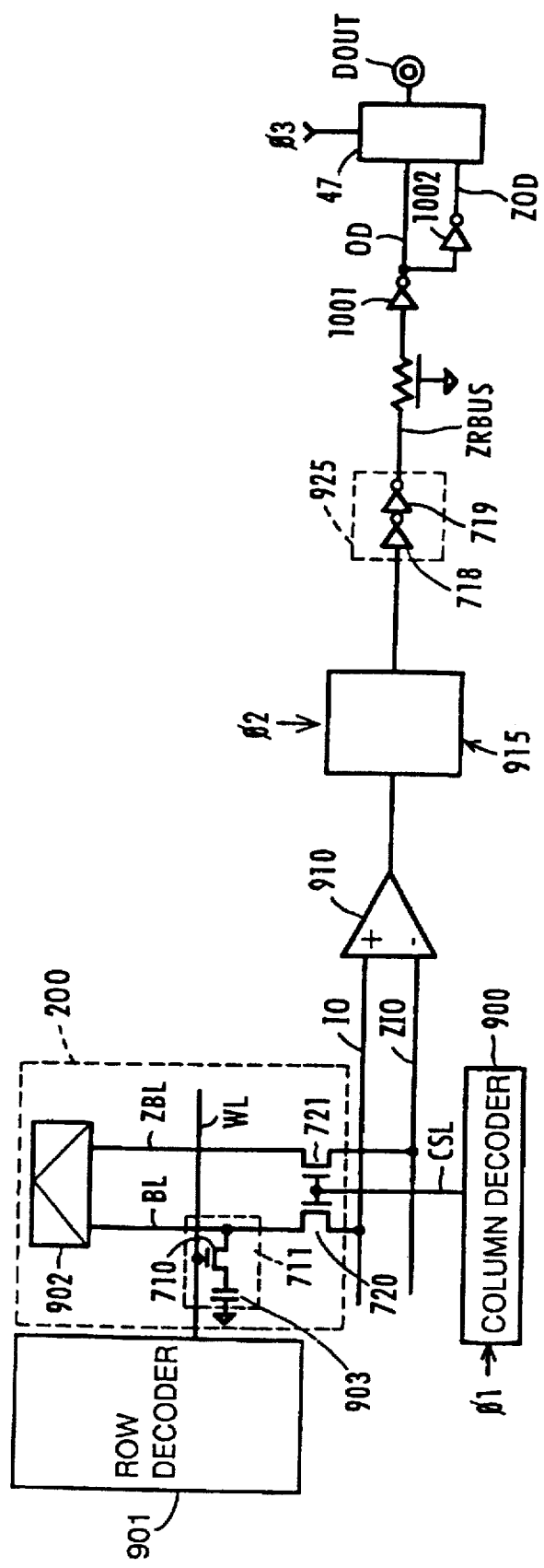
FIG. 14 is a circuit diagram showing a conventional read circuit.

There are differences between the circuit structure shown in FIG. 8 and the conventional example shown in FIG. 14.

First, outputs of data lines IO and ZIO are amplified by complementary differential amplifier 1000 described in the third embodiment.

Second, a selector/data latch circuit 920 is constituted by a selector circuit 230 and latch circuits 240a and 240b each controlled by a clock signal φ1 from clock generating circuit 350.

Finally, both data lines and data buses are arranged as a complementary type.

Selector circuit 230 connects or disconnects outputs RD and ZRD of complementary differential amplifier 1000 to or from data buses in response to an external address signal Add.

When a clock signal φ1 is at an "H" level, a clocked inverter 242 in each of data latch circuits 240a and 240b is deactivated, a signal resulting from inversion of an input signal by an inverter 243 is output from each of data latch circuits 240a and 240b. On the other hand, when a clock signal φ1 is at an "L" level, clocked inverter 242 is activated, and a value of an input signal is retained.

Figure 9:
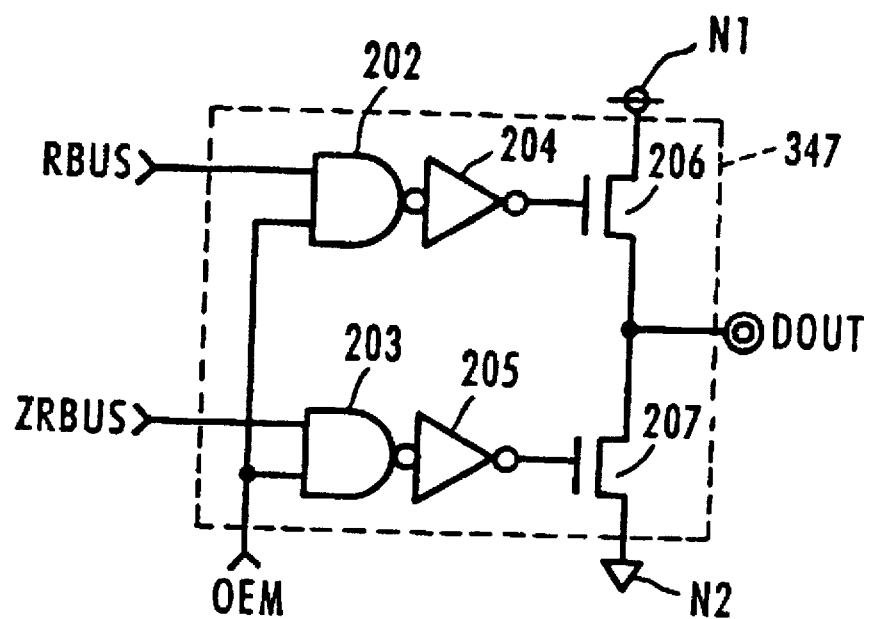
FIG. 9 is a circuit diagram showing an output buffer circuit in the fourth embodiment of the present invention.

FIG. 9 is a circuit diagram showing output buffer 347.

Output buffer 347 includes NAND gates 202 and 203, inverters 204 and 205, and N channel MOS transistors 206 and 207. N channel MOS transistors 206 and 207 are connected in series between a first power supply node N1 at a first potential and a second power supply node N2 which receives a second potential lower than the first potential.

A node between transistors 206 and 207 is connected to an external output terminal DOUT. NAND gate 202 receives a signal OEM and a signal RBUS from a data bus RBUS at its input terminals, respectively. Inverter 204 is connected between an output terminal of NAND gate 202 and the gate of transistor 206.

NAND gate 203 receives a signal OEM and a signal ZRBUS from a data bus ZRBUS. Inverter 205 is connected between an output terminal of NAND gate 203 and the gate of transistor 207.

Accordingly, output buffer 347 operates as follows.

If a signal OEM is at an "L" level, transistors 206 and 207 are in non-conductive states regardless of the values of signals RBUS and ZRBUS, and therefore, an external output terminal DOUT is in a high impedance state.

On the other hand, an example in which a signal OEM is at an "H" level, and both signals RBUS and ZRBUS are at "L" levels until read data is transmitted to output buffer 347 will now be considered. If read data is transmitted in this condition, output buffer 347 is rendered in a state as follows. More specifically, both transistors 206 and 207 are in non-conductive stated and an external output terminal DOUT is in a high impedance state until read data is transmitted to output buffer 347, whereas one of transistors 206 and 207 is rendered conductive when read data is transmitted, whereby a data signal is output to external output terminal DOUT.

Figure 10:
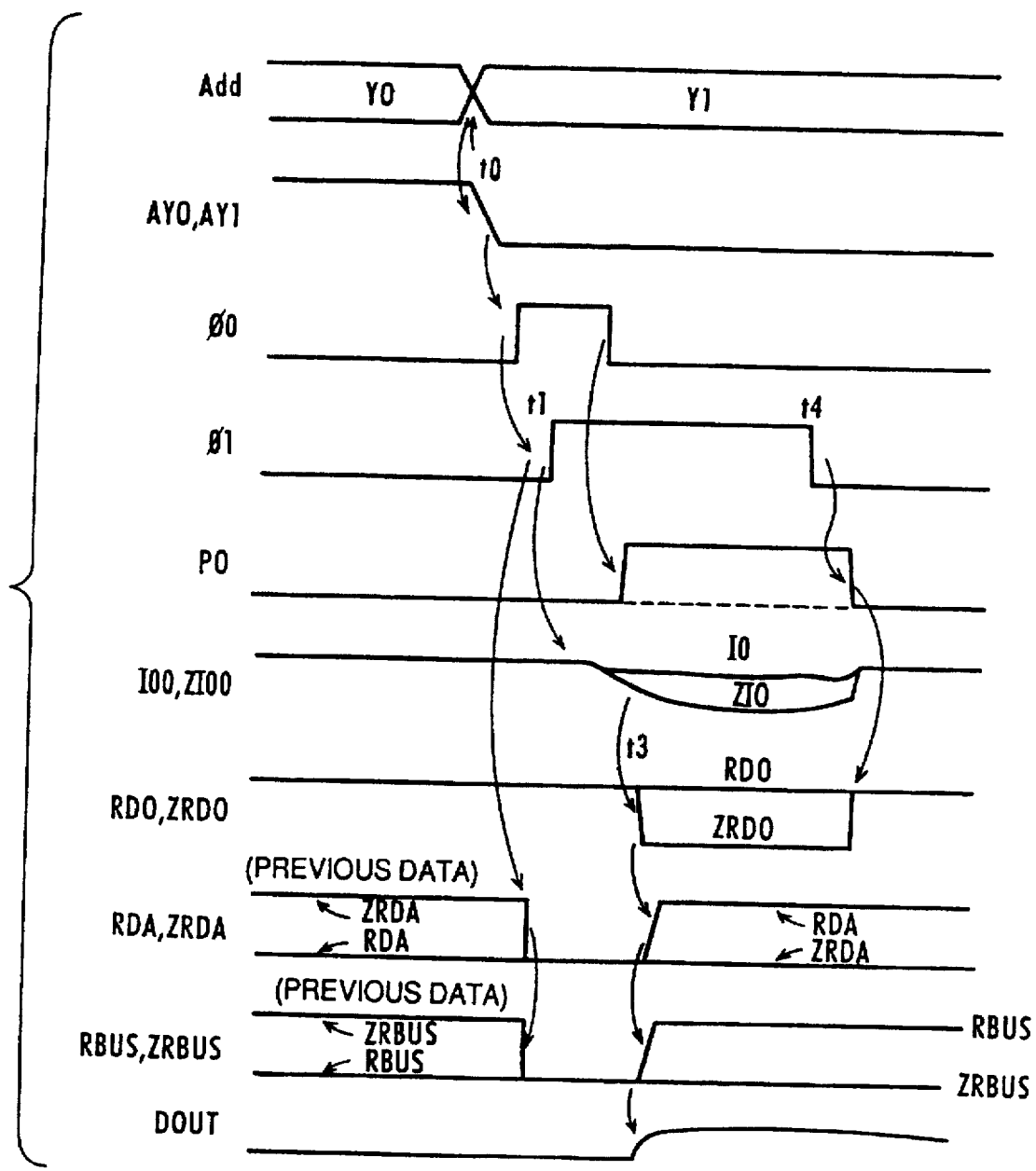
FIG. 10 is a first timing chart showing an operation of the fourth embodiment of the present invention.
Figure 11:
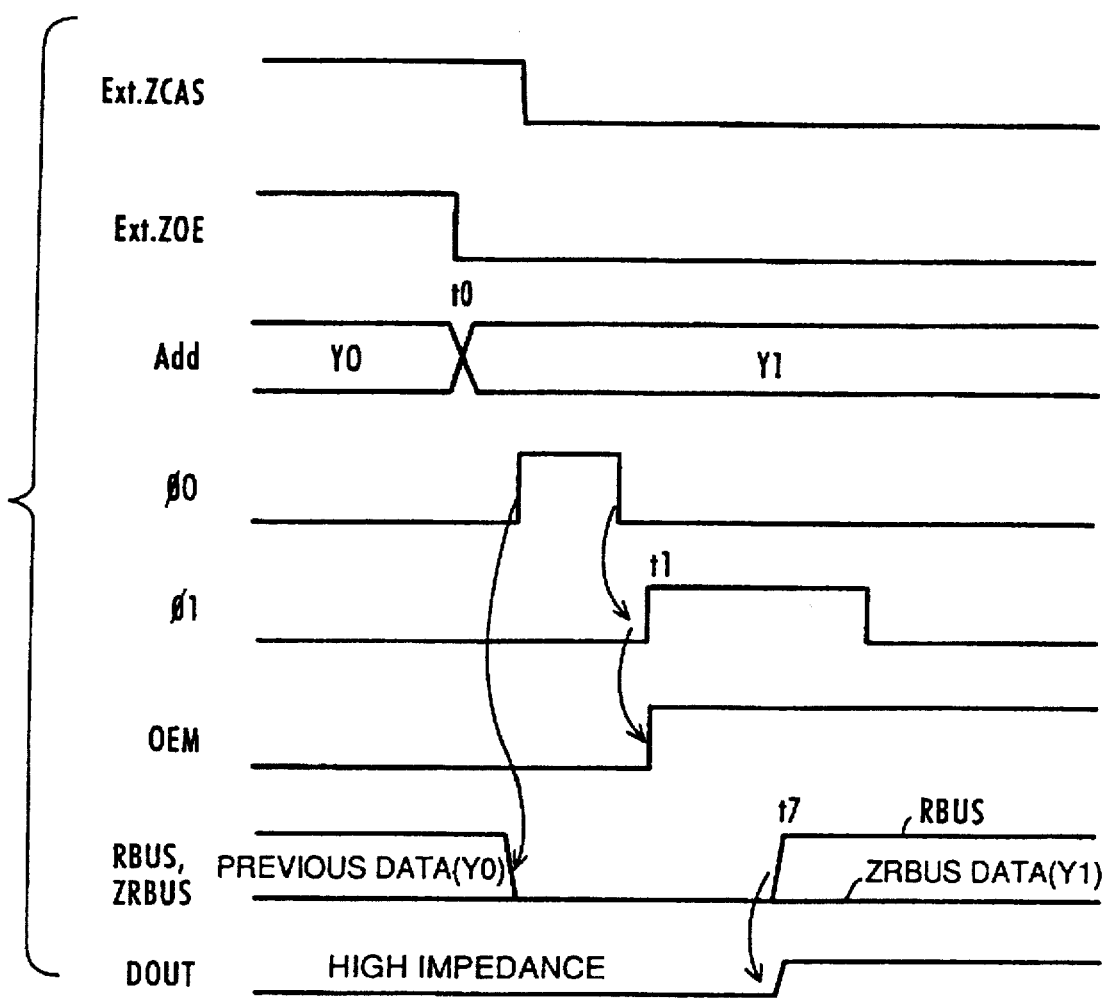
FIG. 11 is a second timing chart showing an operation of the fourth embodiment of the present invention.

An operation of the read circuit shown in FIG. 8 will now be described. FIGS. 10 and 11 are timing charts illustrating an operation of the read circuit shown in FIG. 8. It is herein assumed that a Y address of an external address signal Add changes from Y0 to Y1.

Referring to FIGS. 10 and 11, when a Y address of an external address signal changes from Y0 to Y1 at time t0, both internal Y address signals AY0 and AY1 falls from an "H" level to an "L" level. At this time, a pulse signal φ0 output from an address transition sensing circuit (not shown) is generated.

When a signal φ0 attains an "H" level, a signal φ1 attains an "H" level at time t1. Accordingly, column decoder 304 operates and a column selection signal CSL attains an "H" level.

In addition, when both internal Y address signals AY0 and AY1 fall to an "L" level, selector circuit 230 is rendered conductive and signals RD and ZRD are input to data latch circuits 240b and 240a, respectively.

At time t1, a signal P0 for activating differential amplifying circuit 1000 is at an "L" level. Therefore, signals RD and ZRD output from differential amplifying circuit 1000 is at "H" levels at this time.

Accordingly, signals RDA and ZRDA respectively output from data latch circuits 240a and 240b fall to "L" levels, whereby signals RBUS and ZRBUS output from data bus driver circuit 250 fall to "L" levels. The state in which signals RDA and ZRDA or signals RBUS and ZRBUS are at "L" levels is called a reset state in the following description.

In such a reset state, external output terminal DOUT is kept in a high impedance state even if an external column address strobe signal Ext.ZCAS falls to an "L" level and a signal OEM rises to an "H" level.

Then, when both signals φ0 and φ1 rise to "H" levels, signal P0 rises to an "H" level at time t2.

Accordingly, differential amplifying circuit 1000 operates. Therefore, potential difference between an I/O line pair IO and ZIO is amplified. Consequently, although both signals RD and ZRD have been at "H" levels, signal RD is kept at an "H" level and signal ZRD falls to an "L" level at time t3. However, this occurs at the time of reading data at an "H" level.

When signals RD and ZRD are rendered at an "H" level and an "L" level at time t3, respectively, the reset state in which both signals RDA and ZRDA are at "L" levels is changed to a state in which signal RDA attains an "H" level and signal ZRDA is kept at an "L" level. Thus, the reset state in which both signals RBUS and ZRBUS are at "L" levels is changed to a state in which signal RBUS attains an "H" level and signal ZRBUS is kept at "L" level.

In this condition, transistor 206 in output buffer 347 is rendered conductive, and an external output data signal DOUT applied to external output terminal DOUT attains an "H" level, as a result.

When signal φ1 which has attained an "H" level at time t1 falls to an "L" level at time t4, signals RD and ZRD are stored in data latch circuits 240b and 240a, respectively.

In the operation described above, since a timing when output buffer 347 is in a signal output state is determined by the fact that of one of two complementary signals RBUS and ZRBUS rises from an "L" level to an "H" level, such a delay of an operation due to an external timing signal as in the case of the conventional example will not be produced.

FIG. 12 shows comparison of an operation of output buffer 347 between the conventional single data line arrangement and the complementary type data line arrangement.

FIG. 12(a) is a diagram showing relationship between a level of a data signal and a valid flag (signal φ3). An output data signal DOUT is recognized as valid data only when a valid flag attains an "H" level.

On the other hand, FIG. 12(b) is a diagram showing relationship between a value of data and an output data DOUT in the case of a complementary type data line arrangement.

If both complementary data are at "L" levels, output data is invalid (in this case, an output signal is in a high impedance state), and if one of the complementary data is at an "H" level and the other is at an "L" level, output data is recognized as valid data.

Advantage of a multi-stage structure of a differential amplifying circuit will now be described.

FIG. 13 is a waveform chart showing relationship between a waveform of an output of a differential amplifying circuit and an output of a logic circuit in the following stage such as an inverter which receives the output of the differential amplifying circuit.

FIG. 13(a) shows a waveform of an input to a complementary differential amplifier. FIG. 13(b) shows a waveform of an output signal of the first stage. FIG. 13(c) is a waveform chart showing change in an inverter output in the case where an inverter 1, for example, is driven in response to the output of the first stage.

In the figure, a logic threshold of this inverter 1 is shown by a dotted line.

FIG. 13(d) is a waveform chart of an output of the second stage of the complementary differential amplifier. FIG. 13(e) is a waveform chart of an inverter output in the case where an inverter 2, for example, is driven in response to the output of the second stage.

If inverter 1 is driven by the output of the first stage, it takes a lot of time for the output of the first stage to be less than a logic threshold of the inverter, and therefore, time shown by t11 in the figure is required for an output of the inverter to be inverted.

On the other hand, since the output of the second stage has sufficiently large amplification factor, time required for the output of the second stage to be less than a logic threshold of the inverter is shorter than in the case of the output of the first stage, and therefore, time t12 required for an output of the inverter to be inverted is shorter than t11.

Consequently, delay time of driver circuits and logic circuits in the following stages can be reduced by constituting so that outputs to data lines are produced by a two-stage amplifier.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary differential amplifier for amplifying difference in potential level between complementary inputs to generate complementary outputs, comprising:

cascade-connected internal differential amplifying means of a plurality of stages for receiving said complementary inputs as complementary inputs to a first stage to sequentially amplifying said received complementary inputs, wherein each of said internal differential amplifying means includes a pair of first and second internal output nodes where complementary internal outputs are produced, respectively, a pair of first and second MOS transistors of a first conductivity type having their sources coupled to a first power supply potential, their gates cross-connected to their drains, and their drains respectively connected to said pair of internal output nodes, third and fourth diode-connected MOS transistors of the first conductivity type respectively connected in parallel to said pair of MOS transistors of the first conductivity type and between said first power supply and said pair of internal output nodes, and driving means connected between said pair of internal output nodes and a second power supply for driving said first to fourth MOS transistors in response to said complementary inputs in the case of the first stage and to said complementary internal outputs of the preceding stage in the case of subsequent stages, wherein both said first and second MOS transistors have a first size, and both said third and fourth MOS transistors have a second size, said second size being larger than said first size, where MOS transistor size is defined by (gate width)/(gate length).

2. The complementary differential amplifier according to claim 1, wherein said driving means includes a current source connected to said second power supply, and a pair of fifth and sixth MOS transistors of a second conductivity type having their sources connected to said current source, their gates respectively receiving said complementary inputs in the case of the first stage and receiving said complementary internal outputs of the preceding stage in the case of subsequent stages, and their drains respectively connected to said internal output nodes.

3. The complementary differential amplifier according to claim 2, wherein said complementary differential amplifier is a two-stage amplifier including first and second internal differential amplifying means, and said internal output nodes of said first internal differential amplifying means are directly connected to the gates of said fifth and said sixth MOS transistors in said driving means of said second internal differential amplifying means, respectively.

4. The complementary differential amplifier according to claim 2, wherein said internal differential amplifying means of said first stage of said complementary differential amplifier further includes a seventh MOS transistor of the first conductivity type and an eighth MOS transistor of the second conductivity type connected in series between said first power supply and said current source with a third internal output node interposed therebetween, a ninth MOS transistor of the first conductivity type and a tenth MOS transistor of the second conductivity type connected in series between said first power supply and said current source With a fourth internal output node interposed therebetween, wherein a gate of said eighth MOS transistor receives one of said complementary inputs, in common with the gate of said fifth MOS transistor, a gate of said seventh MOS transistor is connected to said second internal output node, a gate of said tenth MOS transistor receives another input of said complementary inputs, in common with a gate of said sixth MOS transistor, a gate of said ninth MOS transistor is connected to said first internal output node, and said third and fourth internal output nodes are connected to inputs of the subsequent stage, respectively.

5. The complementary differential amplifier according to claim 4, wherein said complementary differential amplifier is a two-stage amplifier including first and second internal differential amplifying means, said third and fourth internal output nodes of said first internal differential amplifying means are connected to the gates of said fifth and sixth MOS transistors in said driving means of said second internal differential amplifying means, respectively, and potentials at said first and second internal output nodes of said second internal differential amplifying means are output as said complementary outputs.

6. The complementary differential amplifier according to claim 3, wherein a current source of said first internal differential amplifying means is an MOS transistor of the second conductivity type for receiving a differential amplifier activation signal at its gate.

7. The complementary differential amplifier according to claim 5, wherein a current source of said first internal differential amplifying means is an MOS transistor of the second conductivity type for receiving a differential amplifier activation signal at its gate.

8. The complementary differential amplifier according to claim 3, wherein a current source of said second internal differential amplifying means is an MOS transistor of the second conductivity type for receiving a differential amplifier activation signal at its gate.

9. The complementary differential amplifier according to claim 5, wherein a current source of said second internal differential amplifying means is an MOS transistor of the second conductivity type for receiving a differential amplifier activation signal at its gate.

10. A semiconductor memory device, comprising:

a memory cell array including a plurality of word lines, a plurality of bit line pairs located across said plurality of word lines, and a plurality of memory cells connected to said word lines and said bit line pairs;

a plurality of I/O line pairs each connected to said bit line pairs through switching means; and a plurality of complementary differential amplifiers provided corresponding to said plurality of I/O line pairs to operate selectively for receiving as complementary inputs and amplifying potential difference between a corresponding I/O line pair, wherein each of said complementary differential amplifiers includes cascade-connected internal differential amplifying means of a plurality of stages for receiving said complementary inputs as complementary inputs of a first stage to sequentially amplify said received complementary inputs, and each of said internal differential amplifying means includes a pair of first and second internal output nodes where complementary internal outputs are produced, a pair of first and second MOS transistors of a first conductivity type having their sources coupled to a first power supply potential, their gates cross-connected to their drains, and their drains respectively connected to said pair of internal output nodes, and diode-connected third and fourth MOS transistors of a first conductivity type respectively connected in parallel to said pair of MOS transistors of a first conductivity type and between said first power supply and said pair of internal output nodes, wherein both said first and second MOS transistors have a first size, and both said third and fourth MOS transistors have a second size, said second size being larger than said first size, and each of said internal differential amplifying means further includes driving means connected between said pair of internal output nodes and a second power supply for driving said first to fourth MOS transistors in response to said complementary inputs in the case of a first stage and to said complementary internal outputs of the preceding stage in the case of subsequent stages, where MOS transistor size is defined by (gate width)/(gate length).

11. The semiconductor memory device according to claim 10, further comprising a first data line for transmitting a first output signal out of complementary outputs of said complementary differential amplifier;

a second data line for transmitting a second output signal out of said complementary outputs of said complementary differential amplifier;

driving means for transmitting said first and second output signals to said first and second data lines, respectively; and output buffer means for receiving signals from said first and second data lines to be rendered in a high impedance state or in a signal output state in response to potentials of the signals, wherein said output buffer means transitions from being in said high impedance state to being in said signal output state according to difference in potential level between signals from said first and second data lines.

12. A complementary differential amplifier for amplifying difference in potential level between complementary inputs to generate complementary outputs, comprising:

a pair of first and second MOS transistors of a first conductivity type having their sources coupled to a first power supply, their gates cross-connected to their drains, and their drains respectively connected to first and second internal output nodes;

third diode-connected MOS transistors of the first conductivity type connected in parallel to said first MOS transistors of the first conductivity type and between said first power supply and said first internal output nodes;

fourth diode-connected MOS transistors of the first conductivity type connected in parallel to said second MOS transistors of the first conductivity type and between said first power supply and said second internal output nodes;

a current source connected between a second power supply and an internal power supply node;

fifth and sixth MOS transistors of a second conductivity type having their sources connected to said internal power supply node, their gates respectively receiving said complementary inputs, and their drains respectively connected to said first and second internal output nodes;

a seventh MOS transistor of the first conductivity type and an eight MOS transistor of the second conductivity type connected in series between said first power supply and said internal power supply node with a third internal output node interposed therebetween; and a ninth MOS transistor of the first conductivity type and a tenth MOS transistor of the second conductivity type connected in series between said first power supply and said internal power supply node with a fourth internal output node interposed therebetween, wherein a gate of said eighth MOS transistor receives one of said complementary inputs, in common with the gate of said fifth MOS transistor, a gate of said seventh MOS transistor is connected to said second internal output node, a gate of said tenth MOS transistor receives the other of said complementary inputs, in common with a gate of said sixth MOS transistor, a gate of said ninth MOS transistor is connected to said first internal output node, a potential level of said third internal output node is driven to the level corresponding to one of said complementary outputs, and a potential level of said fourth internal output node is driven to the level corresponding to the other of said complementary outputs.

* * * * *

UNITED STATES PATENT AND TRADEMARK OFFICE
CERTIFICATE OF CORRECTION

PATENT NO. : 5,696,726
DATED : December 9, 1997
INVENTOR(S) : Yasuhiko TSUKIKAWA It is certified that error appears in the above-identified patent and that said Letters Patent is hereby corrected as shown below:

On the title page, item [54] and column 1:

--[54]  COMPLEMENTARY DIFFERENTIAL AMPLIFIER IN WHICH DIRECT CURRENT AMPLIFICATION GAIN CAN BE SET ARBITRARILY AND SEMICONDUCTOR MEMORY DEVICE USING THE SAME--

Column 1, line 5, "DIVICE" should read --DEVICE--.

Signed and Sealed this

Twenty-fourth Day of February, 1998

Attest:

BRUCE LEHMAN

Attesting Officer

Commissioner of Patents and Trademarks